United States Patent
Barr

(12) 
(10) Patent No.: US 6,319,653 B1
(45) Date of Patent: Nov. 20, 2001

(54) PHOTOIMAGEABLE COMPOSITIONS HAVING IMPROVED STRIPPING ABILITY AND RESOLUTION

(75) Inventor: Robert Barr, Llaguna Niguel, CA (US)

(73) Assignee: Morton International Inc., Chicago, IL (US)

( * ) Notice: Subject to any disclaimer, the term of this patent is extended or adjusted under 35 U.S.C. 154(b) by 0 days.

(21) Appl. No.: 09/376,539

(22) Filed: Aug. 18, 1999

Related U.S. Application Data

(63) Continuation-in-part of application No. 09/209,353, filed on Dec. 11, 1998.

(51) Int. Cl.[7] ............................ G03F 7/033; G03F 7/038
(52) U.S. Cl. ..................... 430/284.1; 430/910; 522/95; 522/97
(58) Field of Search .............................. 430/284.1, 910; 522/95, 97

(56) References Cited

U.S. PATENT DOCUMENTS

| | | | |
|---|---|---|---|
| 4,691,045 | * | 9/1987 | Fukuchi et al. ............... 560/185 |
| 4,843,111 | * | 6/1989 | Yokoshima et al. ............ 522/95 |
| 5,115,025 | * | 5/1992 | Koleske et al. ............... 525/162 |
| 5,166,186 | * | 11/1992 | Kojima et al. ................ 522/37 |
| 5,616,630 | * | 4/1997 | Heinz et al. .................. 522/97 |
| 5,990,192 | * | 11/1999 | Gerlitz et al. ................ 522/97 |
| 6,054,252 | * | 4/2000 | Lundy et al. ................ 430/285.1 |

OTHER PUBLICATIONS

"lactone", from Harcount, http://www.harcount.com, taken from *Academia Press Dictionary of Science and Technology* on Jun. 4, 2000.*

* cited by examiner

*Primary Examiner*—Cynthia Hamilton

(57) ABSTRACT

A negative-acting photoimageable composition useful as a primary imaging resist in the manufacture of printed circuit boards comprises an acid-functional binder polymer, a photopolymerizable component, and a photoinitiator chemical system, in which all or a portion of the photopolymerizable component comprises a (meth)acrylate functional urethane oligomer, wherein the (meth)acrylate functionality is separated from the urethane linkage by at least two alkylene oxide groups and at least one ring-opened lactone group for improved flexibility, tenting strength, fine line adhesion, developer scumming, coupled with unexpectedly improved resistance to processing chemicals, such as alkaline developing solutions, acid etching solutions, and acid plating baths, and stripping ability in strong alkaline aqueous stripping solutions. The acid-functional binder polymer has a low molecular weight and does not contain styrene, contributing to stripping ability and improved resolution.

15 Claims, No Drawings

PHOTOIMAGEABLE COMPOSITIONS HAVING IMPROVED STRIPPING ABILITY AND RESOLUTION

The present application is a continuation-in-part of co-pending U.S. patent application Ser. No. 09/209,353, filed Dec. 11, 1998.

FIELD OF THE INVENTION

The present invention is directed to negative-acting photoimageable compositions such as those used as photoresists in the art of printed circuitry. The photoimageable composition contains, as a portion of its photoimageable component, a (meth)acrylate-functional urethane oligomer, wherein the (meth)acrylate functionality is separated from the urethane linkage by at least two alkylene oxide groups and at least one ring-opened lactone group. Binder polymer for the photoimageable composition is a low-molecular weight, styrene-free polymer which provides enhanced resolution and stripping ability without cold flow and edge fusion.

BACKGROUND OF THE INVENTION

This invention is directed to negative-acting photoimageable compositions which are developable in alkaline aqueous solutions. The invention is particularly applicable to primary photoimaging resists, but is applicable, as well, to compositions that are hardenable so as to form solder masks and the like.

A variety of such photoimageable compositions are described throughout the patent literature. Essential components of the type of photoimageable compositions to which the present invention is directed include I) a binder polymer, II) photopolymerizable $\alpha,\beta$-ethylenically unsaturated compound(s), and III) a photoinitiator chemical system. The binder polymer I) has sufficient acid functionality, generally carboxylic acid functionality, that the binder polymer is soluble in dilute alkaline aqueous solution and thereby renders the photoimageable composition developable in such alkaline aqueous solutions. The photopolymerizable compound(s) II) are monomers and/or short chain oligomers, a substantial portion of which have multiple $\alpha,\beta$-ethylenic unsaturated functionality.

The photoinitiator chemical system III) includes chemicals which generate free radicals upon exposure to actinic radiation. These free radicals propagate the polymerization of the $\alpha,\beta$-ethylenic unsaturated moieties of the photopolymerizable compounds II). Herein, the photoinitiator system II) is deemed to include not only chemical compounds which generate free radicals, but catalysts or sensitizers which promote the free-radical initiated polymerization of the $\alpha,\beta$-ethylenic unsaturated moieties of the photopolymerizable compounds II).

Printed circuit boards almost invariably have through-holes to establish connections with circuitry on opposite faces of the board. Photoresists are required to "tent" these through-holes during processing. With holes becoming larger on circuit boards, higher tenting strength is becoming increasingly important; thus greater flexibility of photoimageable compositions after development is required. Improved flexibility also contributes to improved cross hatch adhesion which allows for better compatibility with automated polyester support film removal systems used to separate a support film from the photoresist after exposure and before development. If the photoresist is brittle, these support film removal systems will cause chipping of the exposed areas of photoresist predominantly at the edges of the panel and subsequently, circuit line defects.

By replacing a portion of conventional photoreactive monomers (like ethoxylated trimethylolpropane triacrylate) with an isocyanuric, urethane-based oligomer, a significant improvement to tenting strength and flexibility was observed. However, even though the flexibility was noticeably better, the fine line adhesion was not improved and the oligomer was shown to be a major source of developer scumming.

Improved flexibility, fine line adhesion and lower developer scumming has been demonstrated when the isocyanuric, urethane-based oligomer is comprised of the product of a polyethoxymono(meth)acrylate and the isocyanurate trimer of hexamethylene diisocyanate, as described, for example, in U.S. Pat. No. 5,744,282. The use of a (meth)acrylate-functional urethane product formed from a mono- or polyalkoxymono(meth)acrylolyl ester, such that the (meth)acrylate functionality is separated from the urethane linkage by one or more flexible alkylene oxide groups, in UV-curable photoresists enhances the performance of such compositions over those made with urethane compounds based on the isocyanurate trimer of hexamethylene diisocyanate. Alternatively, urethane oligomers have been proposed that are formed from monoalkoxymono- or di-caprolactone(meth)acrylolyl esters, which adds a mono- or di-caprolactone chain extension between the monoalkoxy (meth)acrylate functionality and the urethane linkage. Present day commercial applications require further improvements to flexibility, fine line adhesion and developer scumming, while not interfering with the chemical resistance of the photoresist to processing solutions and its stripping ability after formation of the patterned copper circuit lines.

Herein, novel (meth)acrylate-functional urethane oligomers based on polyalkoxy/polylactone (meth)acrylolyl esters are incorporated as at least a portion of the photopolymerizable component II). The (meth)acrylate-functional urethane oligomers of this invention are found to significantly improve flexibility and fine line adhesion of the photoresist and minimize developer scumming. Along with improving the aforesaid properties, it has been found that (meth)acrylate-functional urethane oligomers further enhance the chemical resistance of the exposed photoresist to processing solutions, such as developing, plating and etching solutions, and also its stripping ability in strong alkaline aqueous solutions.

Certain current circuit board manufacturing processes require further improved stripping ability, and improved resolution is always a goal in improved photoresists. In one common manufacturing process, the process begins with a circuit board blank comprising a dielectric substrate, such as fiberglass-reinforced epoxy resin, having a copper layer on each surface. In an initial step through or via holes are drilled. A catalyst is applied to the interior surfaces of these holes allowing a thin layer of copper to be deposited through the holes by electroless plating. Then the entire board is covered on both sides with photoresist, which photoresist is exposed and developed. The board is then electroplated with copper to add sufficient copper in the through holes for adequate electrical conductivity, typically to a thickness of at least one mil (25 microns), and to build up circuitry traces in the exposed regions of the copper surface. Next, a tin or tin/lead metal is plated on exposed copper to act as an alkaline etch resist after stripping of the photoresists. The resist is stripped with an alkaline stripping solution, such as a 2–3% sodium hydroxide solution. Then, the board is alkaline etched, e.g., with ammonium hydroxide solution of about pH 10 or above, to remove copper from between the circuitry traces.

The current trend is for boards to become thicker and via holes to become smaller. In order that sufficient copper be electroplated in the via holes, plating times are increased such that the build-up of circuitry traces often excedes the height of the photoresist pattern, sometimes by as much as 2 mils (50 microns), resulting in mushrooming of the electroplated copper over the photoresist pattern. The overhang of this mushrooming tends to create problems with stripping. While the overhang could be addressed with thicker photoresist layers, resolution would be compromised. Accordingly, it is desirable that a photoresist strip cleanly despite the overhang problem. If a photoresist strips in large particle sizes, it tends to become trapped beneath the overhang, inhibiting etching, causing circuit defects and scrap panel.

SUMMARY OF THE INVENTION

The present invention is directed to a negative-acting photoimageable composition comprises I) between about 30 and about 80 wt %, based on total weight of I) plus II) plus III) of an organic polymeric binder having sufficient acid functionality to render the photoimageable composition developable in alkaline aqueous solution, II) between about 20 and about 70 wt % based on total weight of I) plus II) plus III) of addition-polymerizable, non-gaseous, α,β-ethylenically unsaturated compound(s) capable of forming a high polymer by free-radical initiated chain-propagating addition polymerization, and II) between about 0.1 and about 20 wt % based on the total weight of I) plus II) plus III) of an organic, radiation-sensitive free-radical generating photoinitiator chemical system activatable by actinic radiation to initiate chain-propagating addition polymerization of the addition-polymerizable material.

In accordance with the invention, an improvement is wherein component II) of the photoimageable comprises between about 1 wt % and about 100 wt %, preferably at least about 20 wt % up to about 60 wt %, based on the total weight of II) of a novel (meth)acrylate-functional urethane oligomer represented by the formula:

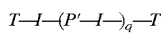

where I at each independent occurrence is selected from a polyfunctional aliphatic, cycloaliphatic, or aromatic isocyanate radical having an isocyanate functionality of 2 or greater, preferably an isocyanate radical of the formula:

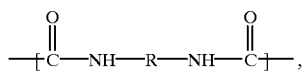

or oligomeric, biuret, or isocyanurate thereof, where R is a polyvalent aliphatic, cycloaliphatic, or aromataic hydrocarbon group, with hexamethylene, cyclohexylene, and phenylene being generally preferred, T is bonded to each of the 2 or more isocyanate functionalities present in I not bonded to P' and at each independent occurrence is selected from a (meth)acrylate-functional organic radical of the formula:

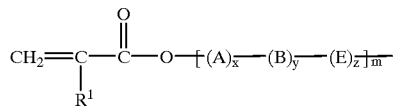

where $R^1$ is a hydrogen atom or a methyl group, A, B and E are in the order given or in any order, preferably in the order given A is an alkylene oxide group of the formula: —[—$(CH_2)_n$—O—]—, or aromatic-substituted derivative thereof, where n is an integer from 1 to 20, preferably 2 to 4, linear, branched, or cyclic, and, x is an integer from 1 to 40, B is an alkylene oxide group of the formula: —[—$(CH_2)_{n1}$—O—]—, or aromatic-substituted derivative thereof, where n1 is an integer from 1 to 20, preferably 2 to 4, linear branched, cyclic, and y is an integer from 0 to 40, with the alkylene oxide group of B being different from that of A, and A plus B being formed from at least 2 alkylene oxide groups, preferably from 4 to 12 alkylene oxide groups, and E is an ester group of the formula:

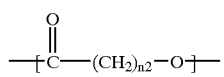

where n2 is an integer from 1 to 20, preferably 3 to 5, linear, branched, or cyclic, or a lactam group of the formula:

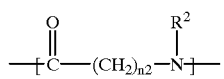

where n2 is defined above and $R^2$ is defined below, although a lactone group is generally preferred, and z is an integer from 1 to 40, preferably 3 to 8, and m is an integer from 1 to 40, with m typically being 1, and P' is selected from any polyfunctional alcohol group, thiol group, amine group or phosphate group, with a polyfunctional alcohol group being generally preferred; and, q is 0 or an integer from 1 to 10.

In the above, if q is 1 or more, P' is even more preferable a polyfunctional alcohol group represented by the formula: —[—O—G—]— where G is of the formula:

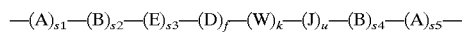

where A, B, E and R are defined above, and f, k, and u may be, 0 or 1, D is an diester functional alkoxy radical of the formula:

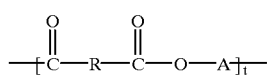

where t is an integer from 1 to 40, W is a radical of the formula:

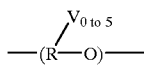

where V is an acidic group selected from —COOH, —SO$_3$H, and PO$_3$HR$^2$ where R$^2$ is a hydrogen atom or a C$_{1-18}$ alkyl radical, J is an ester functional alkyl radical of the formula:

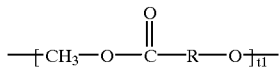

where t1 is an integer from 1 to 6, and, with the proviso that if f+k+u=0, then $\Sigma s_1 \ldots s_5$ must be $\geq 1$.

The use of the (meth)acrylate-functional urethane oligomer for all or part of the photopolymerizable component II) of the photoimageable composition, wherein the (meth) acrylate functionality in the oligomer is separated from the urethane linkage by a flexible block copolymer of at least two alkylene oxide groups and at least one ring-opened lactone group, solves the problems of the prior art and enables the photoimageable composition formed therefrom to possess excellent mechanical strength, flexibility, fine line adhesion, and resistance to developer scumming, combined with excellent chemical resistance to processing solutions and stripping ability.

Generally in photoresists of this type, high molecular weight polymers are used, i.e., having molecular weights (weight average) of at least about 80,000, up to about 200,000. High molecular weight polymers provide good adhesion, tenting strength and roll properties. Lower molecular weight polymers, i.e., having number average weights below about 60,000 are recognized as promoting faster developing time, higher resolution, and enhanced stripping. However, the use of low molecular weight polymers has heretofore been strictly limited. If as much as 50% of the polymer comprised a molecular weight of 60,000 or below, severe edge fusion and tenting strength reductions were observed. A 100% low molecular weight polymer system (Mw 60,000 or below), in prior art systems, would make the fusion and tent strength considerably worse.

Herein, it is found that when using the polyester oligomers as described in above-referenced U.S. Pat. No. 6,054,242, in combination with a low-molecular weight, styrene free binder polymer system, excellent stripping ability along with high resolution is achieved, without associated problems with edge fusion and lack of tenting strength.

The present invention also provides a photoimageable element comprising a support film and a layer of said photoimageable composition formed thereon.

DETAILED DESCRIPTION OF CERTAIN PREFERRED EMBODIMENTS

Herein, unless otherwise noted, all percentages are weight percentages. Molecular weights are weight average molecular weights (Mw) unless otherwise noted. Component I) (the binder polymer) and Component II) (the photoimageable compounds(s)) and Component III) (the photoinitiator chemical system) are herein considered to equal 100 wt %, and other components are calculated as parts relative to 100 parts of I) plus II) plus III).

The term "(meth)acrylate" is meant to encompass "acrylate" and "methacrylate" functionality and mixtures thereof.

The invention is directed to photoimageable compositions which are developable in alkaline aqueous solution and which therefore have substantial acid functionality. The photoimageable compositions of the invention have a binder polymer I) having acid functionality, providing an acid number of between about 150 and about 300, preferably 180 to 250 The acid functionality is typically carboxylic acid functionality, but may also include, for example, sulfonic acid functionality or phosphoric acid functionality. All of the binder polymer used in the photoimageable compositions of the invention has a molecular weight of between about 5000 and about 60,000, 20,000 to 40,000 being a preferred molecular weight range. Furthermore, the binder polymer of the present invention contains no styrene or styrene homologues, such as methyl styrene.

The polymers are typically derived from a mixture of acid functional monomers and non-acid functional monomers. Some specific examples of suitable acid functional monomers are acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer.

The acid functional monomers may be copolymerized with non-acid functional monomers, such as esters of acrylic acid and methacrylic acid, for example, methyl acrylate, 2-ethyl hexyl acrylate, n-butyl acrylate, n-hexyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl pentaerythritol tetramethacrylate, trimethylol propane trimethacrylate, and 1,5-pentanediol dimethacrylate. Sufficient acid functional monomers are used to provide the desired acid number.

The amount of the binder polymer I) may vary over a wide range, typically comprising between about 30 to about 80 wt % of the composition based on total weight of I) plus II) plus III).

Examples of such polymers and photoimageable compositions using such polymers are found, in the following U.S. Pat. Nos. 3,953,309, 4,003,877, 4,610,951, and 4,695,527 the teaching of each of which are incorporated herein by reference.

The photopolymerizable component II) described above having photopolymerizable poly α,β-ethylenic unsaturation comprises between about 1 wt % and about 100 wt %, preferably at least about 20 wt % up to about 60 wt % of total amount of II), of the (meth)acrylate-functional urethane oligomer described above, i.e., between about 2 wt % and 70 wt %, preferably between about 5 wt % and 45 wt % based on total weight of I) plus II) plus III).

There are two currently preferred methods for forming the (meth)acrylate-functional urethane oligomers of this invention. The preferred method of forming the first group of urethane oligomers defined in the above formula by q=0 is to initially block copolymerize one or more lactone groups and two or more alkylene oxide groups onto a (meth)acrylic acid backbone by a conventional addition polymerization procedure, to produce the (meth)acrylate-functional group of formula T which has a hydroxy-terminus opposite the (meth)acrylate functionality.

While in the above described formula for T, (A), (B) if present, and (E) may theoretically be in any order, the preferred mode of oligomer synthesis generally dictates that (E) be at the terminus opposite the (meth)acrylate functionality. In the preferred synthetic route, (meth)acrylic acid is reacted with an alkylene oxide monomer or aromatic-substituted alkylene oxide monomer or a mixture of such monomers so as to produce (A). If desired, further reaction is carried out with an different alkylene oxide monomers, aromatic-substituted alkylene oxide monomers or mixture of such monomers to produce (B). The resulting product is then reacted with a lactone or lactam monomer or mixture of lactone or lactam monomers, to produce (E).

Alkylene oxide monomers used in forming the (A) and (B) alkylene oxide groups generally contain 1 to 20 carbon atoms, although short chain alkylene oxides of at least 2 up to 4 carbon atoms, such as ethylene oxide, propylene oxide, butylene oxide and tetrahydrofuran, with ethylene oxide and propylene oxide being preferred. Also, aromatic-substituted alkylene oxide monomers, such as styrene oxide, may be used to form (A) and (B). While (B), if present, is herein defined as is (A), (B) is formed from a different monomer from (A). For example (A) could be formed from ethylene oxide and (B) could be formed from propylene oxide, or (A) could be formed from a mixture of ethylene oxide and tetrahydrofuran while (B) could be formed from a mixture of propylene oxide and styrene oxide. The optional incorporation of (B) allows the oligomer to be tailored to particular applications. To provide sufficient chain length to the oligomer, (A) plus (B) must be formed from at least 2 alkylene oxide monomers total, preferably between 4 and 12 monomers.

The ester component (E) of the (meth)acrylate functional oligomeric group defined in above formula T is formed from 1 to 40 lactone monomer units, either a single lactone species or mixture of lactone species. The lactone species employed generally have from 1 to 20 carbon atoms (not including the carbonyl carbon), although 3 to 5 carbon atom species are generally preferred. Epsilon-caprolactone is especially preferred aster for forming (C). Other suitable esters include, but are not limited to, beta-butyrolactone, zeta-enantholactone, delta-valerolactone. Also, $C_1$–$C_6$ alkyl-substituted lactones, such as the alkyl delta-valerolactones, such as methyl-, ethyl-, hexyl-, dimethyl-, diethyl-, di-n-propyl-, di-n-hexyl-, di-iso-propyl-, trimethyl-, triethyl-, and tri-n-propyl-epsilon caprolactones, as well as $C_1$–$C_6$ alkoxy- and aromatic-substituted lactones may also be used. In addition to lactones, lactams may be substituted for forming component (E). Suitable lactams include those which correspond to the lactones listed above, with epsilon-caprolactam being especially preferred.

The oligomer thus formed is hydroxy-terminated at the terminus opposite the (meth)acrylate functionality. Subsequently, the hydroxy-terminated (meth)acrylate oligomer is reacted with a polyfunctional isocyanate used in forming I in the above formula by a conventional urethane addition polymerization procedure, to produce the (meth) acrylate-functional urethane oligomer component II) of the present invention.

In the urethane reaction, the conditions are chosen so that the hydroxy terminal functionality of the (meth)acrylate functional oligomer reacts with all of the isocyanate functionalities present in I, to end-cap each of the isocyanate groups with T. In the above formula, only 2 T's are shown as a matter of convenience, However, it should be understood that if I is tri-functional, rather than di-functional, 3 isocyanate end-capping T's will be present instead of 2 T's, and so on.

The polyfunctional isocyanates used in forming I can be a wide variety of organic isocyanates having a functionality of 2 or greater, or oligomers, biurets, or isocyanurates thereof. In the general formula above, simple examples of R groups include hexamethylene, phenylene, and cyclohexylene, although more complex divalent hydrocarbon moieties are also suitable. The choice of R is generally not considered to be particularly critical, the selection generally depending upon the commercial availability of suitable precursors. Examples of suitable polyisocyanates include 1,6-hexamethylene diisocyanate, 1,4-tetramethylene diisocyanate, 1,3- and 1,4-phenylene diisocyanate, 4,4'-methylenebis(phenylisocyanate), 2,4-toluene diisocyanate, 1,2,4-benzene triisocyanate, 1,4-cyclohexylene diisocyanate, isophorone diisocyanate, 4,4'-methylene bis (cyclohexyl isocyanate), polymethylene polyphenyl isocyanate, or biurets thereof, such as the biuret of hexamethylene diisocyanate, or isocyanurates thereof, such as the isocyanurate of hexamethylene diisocyanate, although hexamethylene diisocyanate, its biuret and its isocyanurate are especially preferred.

The preferred method for forming the second group of urethane oligomers where q≧1 is to initially react the polyfunctional isocyanate with a polyfunctional alcohol by a conventional addition polymerization procedure, to form a polyisocyanate/polyol adduct represented by the formula I—(P'—I)$_q$. As can be seen from the formula, the reaction conditions are chosen so as to form an isocyanate-terminated urethane oligomer to the virtual exclusion of alcohol-terminated polymeric materials. The optional incorporation of the (P'—I)$_q$ group into the urethane oligomer allows the oligomer to be tailored to particular applications. Subsequently, the isocyanate-terminated adduct is reached with the hydroxy-terminated (meth)acrylate oligomer T defined above by a conventional urethane addition polymerization procedure, to produce the (meth)acrylate-functional urethane oligomer component II) of the present invention.

The polyfunctional alcohol may be selected from a variety of materials as indicated by the polyfunctional alcohol group defined as —[—O—G—]— in the above formula. Examples of suitable polyfunctional alcohols include: monomeric or polymeric diols, such as ethylene glycol, propylene glycol, 1,4-butanediol, 2-ethyl-1,6-hexanediol, 1,10-decanediol, 1,4-bis-hydroxymethylcyclohexane, diethylene glycol, triethylene glycol, polyethylene glycols having molecular weights (Mw) from about 200 to 1,500, the reaction products of 4,4'-dihydroxydiphenyl ether, 4,4'-dihydroxydiphenyl sulfide, 4,4'-dihydroxydiphenyl methane, 4,4'-dihydroxydiphenylpropane or 4,4'-dihydroxydiphenylsulfone with 0 to 40 moles of alkylene oxide, dihydroxycycloalkyls, bishydroxydicycloalkyls, polypropylene glycols, polytetrahydrofuran, polybutylene glycols, thioethylene glycol and dithiotriethylene glycol; polyester polyols, such as polycaprolactone, polybutyrolactone, polyethylene terephthalate, polypropylene adipate, polybutylene adipate, polyethylenebutylene sebacate, and other polyester polyols having molecular weights (Mw) in the range of about 500 to 3,000. Apart from the diols, monomer or polymeric compounds having 2 to 6 aliphatic hydroxy groups, such as glycerol, trimethylolpropane, pentaerythritol, dipentaerythritol, sorbitol, or polyalkoxylate derivatives of these; polymeric polyester polyols including the lactone polyesters; block copolymers of polyethers and polyesters having terminal hydroxy groups; and, caprolactone polyols and polysiloxane polyols, or the like. Other polyfunctional alcohols which contain acidic groups may also be used, including those described in U.S. Pat. No. 5,415,972. In addition to polyfunctional alcohols, polyfunctional amine, thiol or phosphate compounds may be substituted. For instance, examples of suitable polyfunctional amines include 1,6-hexanediamine, isophoronediamine, diaminodiphenylmethane, polyalkoxydiamines, etc. Examples of polyfunctional thiols include 1,2-ethanedithiol, 1,4-butanedithiol, 1,6-hexanedithiol, 1,9nonanedithiol, etc. Examples of polyfunctional phosphates include any of a variety of available diphosphates.

Through use of the above-described (meth)acrylate-functional urethane oligomer whereby the chain which links the (meth)acrylate functionality to the urethane group is, extended with at least two alkylene oxide groups and at least one ring-opened lactone or lactam group, improved flexibility and tenting strength of the cross-linked system is achieved, The flexibility is achieved by incorporation of a long chain attached to the crosslinkable ethylenically unsaturated (meth)acrylate functionality. Coupled with improved flexibility, the urethane oligomer improves the adhesive properties of the resist to the copper clad surface of blank circuit board following lamination. Better adhesion enables the production of a fine line (less than 75 microns) resist sidewall that adheres better to the copper surface of the circuit board.

Most surprising is the improvement seen in stripping and chemical resistance to processing solutions. Because the urethane oligomer produces better adhesion, stripping the resist from the copper surface would be expected to be more difficult. While not wishing to be bound by any particular theory, it is believed that by distancing the (meth)acrylata functionality from the urethane block with not only flexible alkylene oxide groups but also durable and high modulus lactone or lactam groups, the ester links present in the ring-opened lactone or lactam portion provide sites for hydroxide attack during the stripping operation, thereby greatly shortening stripping time. While producing sites for stripping solution attack, the relatively hydrophobic chain extension also provides good chemical resistance to alkaline developing solution, acid plating baths and acid etching solutions.

The balance of photopolymerizeable component II), if any, is typically a monomer, dimer or short chain oligomer having ethylenic unsaturation, particularly, α,β-ethylenic unsaturation, including monofunctional compounds and compounds having α,β-ethylenic unsaturation functionality 2 or greater. Typically, a mixture of mono-functional and multi-functional monomers will be used. Suitable photopolymerizeable compounds include, but are not limited to, the monomers recited above as suitable for forming binder polymers, particularly the non-acid functional compounds.

The total amount of photopolymerizeable component II) is typically between about 20 and about 70 wt % of the photoimageable composition based on total weight of I) plus II) plus III).

To initiate polymerization of the monomers upon exposure to actinic radiation, the photoimageable composition contains a photoinitiator chemical system. Generally, the photoinitiator chemical system comprises between about 0.1 and about 20 wt % based on total weight of I) plus III) plus III). Suitable photoinitiator chemicals include, but are not limited to, 9-phenylacridine, n-phenyl glycine, aromatic ketones (benzophenone, N, N'-tetramethyl-4, 4'-diaminobenzophenone [Michler's ketone], N,N'-tetraethyl-4,4'-diaminobenzophenone,4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone), benzoins (benzoin, benzoinmethylether, benzoinethylether, benzoinisopropylether, benzoin-n-butylether, benzoin-phenylether, methylbenzoin, ethybenzoin, etc.), benzyl derivatives (dibenzyl, benzyldiphenyidisulfide, benzyldim-ethylketal (SIC), etc.), acridine derivatives (9-phenylacridine, 1,7-bis(9-acridinyl)heptane, etc.), thioxanthones (2-chlorothioxanthone, 2-methylthioxanthone, 2,4-diethylthioxanthone, 2,4-dimethylthioxanthone, 2-isopropylthioxanthone, etc.), acetophenones (1,1-dichloroacetophenone, p-t-butyidichloroacetophenone, 2,2-diethoxyacetophenone, 2,2-dimethoxy-2-phenylacetophenone, 2,2-dichloro-4-phenoxyacetophenone, etc.), 2,4,5-triarylimidazole dimers (e.g., 2-(o-chlorophenyl)-4,5-diphenylimidazole dimer, 2-(o-chlorophenyl)-4,5-di(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, etc.) etc. Though, not a free-radical generator, triphenylphosphine may be included in the photoinitiator chemical system as a catalyst.

The photoimageable composition may advantageously include one or more plasticizers at between about 0.5 and about 10 wt % relative to the total weight of i) plus II) plus III). Examples of suitable plasticizers include, but are not limited to, phthalate esters (e.g., dibutylphthalate, diheptylphthalate, dioctylphthalate, diallylphthalate), glycols (e.g., polyethylene-glycol, polypropyleneglycol), glycol esters (e.g., triethylene-glycoldiacetate, tetraethyleneglycoldiacetate, dipropyleneglycol-dibenzoate), phosphate esters (tricresylphosphate, tripheynlphosphate), amides (p-toluenesulfoneamide, benzenesulfoneamide, -n-butylacetoneamide), aliphatic dibasic acid esters (diisobutyl-adipate, dioctyladipate, dimethylsebacate, dioctylazelate, dibutylmalate, triethylcitrate, tributylcitrate, triethylacetylcitrate, tri-n-propylacetylcitrate, tri-n-butylacetylcitrate, butyl-laurate, dioctyl-4,5-diepoxycyclohexane-1,2-dicarboxylate, glycerinetriacetylesters, dipropyleneglycol dibenzoate, polyethyleneglycol 200 dibenzoate, sucrose benzoate, trioctyl trimellitate, etc.

Compositions of the present invention typically include a color former to provide contrast to the light-exposed photoimageable composition. Color formers are typically used at between about 0.1 and about 1.0 wt % relative to total weight of I) plus II) plus III). Suitable color formers include, but are not limited to, diphenylamine, dibenzylaniline, triphenylamine, diethylaniline, diphenyl-p-phenylenediamine, p-toluidine, 4,4'-biphenyldiamine, o-chloroaniline, etc., leuco crystal violet, leuco malachite green, etc.

Additionally, the photoimageable compositions may contain a wide variety of additional components as are known in the art, including additional polymers, such as those which might be used to effect a final hardened cure of a solder mask, dyes, color formers, stabilizers, flexibilizing agents, fillers, etc.

Processing of the photoimageable composition is in a conventional manner. In a typical procedure, a photoimageable composition layer, either formed from a liquid composition or as transferred as a layer from a dry film, is applied to a copper surface of a copper-clad board. When a dry film is used, the dry film typically comprises a liquid photoimageable composition dried onto a flexible polyester support sheet, e.g., polyethylene terephthalate, which is preferably transparent. A protective sheet, e.g., polyethylene, is usually provided on the surface of the dried photoimageable layer opposite the support sheet before the film is rolled into reels. The protective sheet is removed prior to application, e.g., lamination, to the copper-clad board. Once applied to the board (with the photoimageable composition facing the board), the photoimageable composition is then exposed to actinic radiation through appropriate artwork. Exposure to actinic radiation polymerizes the monomer in the light-exposed areas, resulting in a cross-linked structure that is resistant to developer. Next, the support film is removed from the top of the photoimageable composition and the exposed photoimageable layer is then is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. After development, an alternative process would be to build up the thickness of the exposed copper areas using an electrolytic plating procedure. After either etching or plating, the remaining resist is then removed using an appropriate stripper, such as 3% sodium hydroxide solution.

This invention is applicable to photoresists used in both etching and electrolytic plating processes. A particular advantage is enhanced resistance to process solutions coupled with rapid removal in stripping solutions which is truly a unique combination of properties not normally encountered with highly chemically resistant photoresists.

In some cases, very high cross-link density of the exposed photoresist is desired. Cross-link density may be enhanced by providing acrylate functionality to the binder polymer. This may be done for example by reacting a compound, such as glycidyl methacrylate, with acid functionality of the polymer or by reacting a compound, such as hydroxyethyl (meth)acrylate with anhydride functionality of the polymer. Such acrylate functionality may function even better, if spaced away from the polymer backbone, e.g., with a polyester chain, such as described in U.S. Pat. No. 6,054,252. To significantly increase cross-link density, the acrylate monomer content should be between about 1.0 and about 20.0 mole percent of the monomer content of the polymer.

The invention will now be described in greater detail by way of specific examples.

EXAMPLE 1

Preparation of Urethane Oligomers Comprising Polyfunctional Isocyanates End-Capped with Poly(alkoxylated)/Poly(lactone) Block Copolymer Mono(meth)acrylates Urethane oligomers of the general structure T—I—(—P'—I—)$_q$—T where q=0 of this example were prepared by the following procedure. A reaction vessel, fitted with a stirrer, thermocouple, and temperature bath, is charged with a poly(alkoxylated)/poly(lactone) mono(meth)acrylate alcohol (derived from polylactone additions to a polyalkoxylated mono(meth)acrylate alcohol), antioxidants, and catalyst. Thereafter, the polyisocyanate is slowly added to the agitated alcohol mixture under a dry air blanket at an NCO/OH ratio of about 0.9/1.0. The temperature is controlled throughout the addition process and usually is held at 30°–35° C. After all of the isocyanate has been added, the mixture is held at 35°±5° C. for 1–4 hours, then cooled to ambient conditions and packaged.

The antioxidants used in these synthesis are of the phenol types and are either hydroquinone monomethyl ether and/or octadecyl 3,5-bis(1,1-dimethylethyl)-4-hydroxybenzene-propanoate, but selection does not have to be limited to these two materials.

The catalysts used in these synthesis can be of any of the usual organometallics commonly utilized in urethane reactions, but in all of the examples cited has been dibutyltin dilaurate.

Examples of urethane oligomers prepared by this method include:

Compound 1

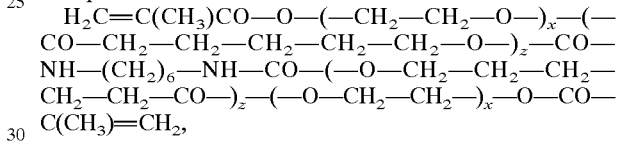

where in T: for (A), x=5–6, for (B), y=0, and for (E), z=3, 4, or 6.

Compound 2

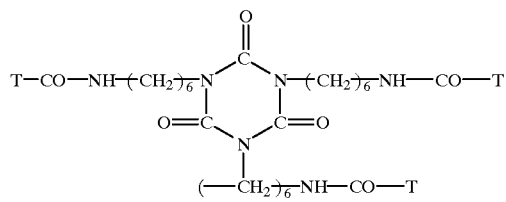

where T is: H$_2$C=C(CH$_3$)CO—O—(—CH$_2$—CH$_2$—O—)$_x$—(—CO—CH$_2$—CH$_2$—CH$_2$—CH$_2$—CH$_2$—O—)$_z$— and for (A), x=5–6, for (B), y=0 , and for (E), z=3, 4, or 6.

EXAMPLE 2

Preparation of Urethane Oligomers Comprising Polyfunctional Isocyanate Prepolymers End-Capped with Poly(alkoxylated)/Poly(lactone) Block Copolymer Mono(meth)acrylates Urethane oligomers of the general structure T—I—(—P'—I—)$_q$—T where q≧1 of this example were prepared by the following procedure. First, a reaction vessel, fitted with a stirrer, thermocouple, and temperature bath is charged with a polyisocyanate and catalyst. Thereafter, a polyfunctional alcohol (hereafter referred to as a polyol) is slowly added under dry nitrogen to the agitated isocyanate mixture (preheated to about 40° C.) at a NCO/OH ratio of about 2.04/1.0, to produce an isocyanate-terminated polyol adduct. The mixture temperature is allowed to elevate (from the exotherm) to approximately 60° C., and then controlled to keep the exothermic rise from exceeding 60° C. until all of the polyol has been added and the exotherm has peaked. The temperature is then maintained at anywhere from 60° C. to 80° C., depending on the selection of polyol and polyisocyanate, for 1 to 2 hours, and then is cooled to below 40° C.

In a second reaction vessel, also fitted with a stirrer, thermocouple, and temperature bath, is charged a poly (alkoxylated)/poly(lactone) mono(meth)acrylate alcohol (meth)acrylate monoalcohol and antioxidant. Under a dry air blanket, the polyisocyanate reaction product from the first vessel is slowly added to the agitated (meth)acrylate alcohol mixture, at an NCO/OH ratio of 1.0/1.0, keeping the temperature at 30°–35° C. After all of the polyisocyanate reaction product had been added, the temperature is held at 35°±5° C. for 1 to 4 hours, then is cooled to ambient and packaged.

Examples of the urethane oligomers which have been prepared by this method include: In all cases T=H$_2$C=C(CH$_3$)CO—O—(—CH$_2$—CH$_2$—O—)$_{5-6}$—(—CO—CH$_2$—CH$_2$—CH$_2$—CH$_2$—CH$_2$—CH$_2$—O—)$_4$— and for (B), y=0 and, I=—CO—NH—(CH$_2$)$_6$—NH—CO—

Compound 3

P' follows the structure —[—O—G—]— where G=—(A)$_5$—(W)—(A)$_5$— and W=bisphenol A, or in other words, P'=—(—O—CH$_2$—CH$_2$—)$_5$—(Bisphenol A)—(—CH$_2$—CH$_2$—O—)$_5$— and, q=1

Compound 4

P' follows the structure —[—O—G—]— where G=—(A)$_3$—(W)—(A)$_3$— and W=bisphenol A, or in other words, P'=—(—O—CH$_2$—CH$_2$—)$_3$ —(Bisphenol A)—(—CH$_2$—CH$_2$—O—)$_3$— and, q=1

Compound 5

P' follows the structure —[—O—G—]— where G=—(A)$_7$—, or in other words,

P'=—O—CH(CH$_3$)—CH$_2$—[—O—CH$_2$—CH(CH$_3$)—]$_6$—O— and, q=1

Compound 6

P' follows the structure —[O—G—]— where G=—(A)$_{13}$—, or in other words,

P'=—O—CH(CH$_3$)—CH$_2$—[—O—CH$_2$—CH(CH$_3$)—]$_{12}$—O— and, q=1

Compound 7

P' follows the structure —[—O—G—]— where G=—(A)$_{17}$—, or in other words,

P'=—O—CH(CH$_3$)—CH$_2$—[—O—CH$_2$—CH(CH$_3$)—]$_{16}$—O— and, q=1

Compound 8
Follows the structure T—I—(—P'—I)$_3$—T or T—I—P'—I—P'—I—P'—I—T,

P' follows the structure —[—O—G—]— where G =—(A)$_5$—(W)—(A)$_5$— and W=bisphenol A, or in other words, P'=—(—O—CH$_2$—CH$_2$—)$_5$—(Bisphenol A)—(—CH$_2$—CH$_2$—O—)$_5$— and, q=1, P" follows the structure —[—O—G}— where G=W=

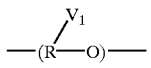

where V=COOH, or in other words

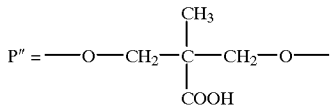

Compound 9

Is like Compound 8 except that

P' follows the structure —[—O—G—]— where G=—(A)$_7$, or in other words,

P'=—O—CH(CH$_3$)—CH$_2$—[—O—CH$_2$—CH(CH$_3$)—]$_6$—O— and, q=1

Compound 10

Is like Compound 3 except that

P' follows the structure —[—O—G—]— where G=J and for J, R=C$_{18}$H$_{34}$ and t1=~3, or in other words, P' is Castor Oil Compound 11

Is like Compound 10 except that

P' follows the structure —[—O—G—] where G=J—A$_5$, and for J, R=C$_{18}$H$_{34}$ and t1=~3, or in other words, P' is ethoxylated Castor Oil (15 moles EO).

EXAMPLE 3

Comparison of Negative-Acting Photoresists

A base formulation for photoresists was prepared containing the components of Table A.

TABLE A

| Chemical Ingredients | Optimum Level (% of solids) |
|---|---|
| Ethoxylated BisPhenol "A" dimethacylate | 12.4 |
| Bis chloro imidiazole | 3.0 |
| Dipropylene glycol dibenzoate (3501-35-00, 3500-35-00) | 4.5 |
| Ethyl Michler's Ketone | 0.05 |
| 9-phenyl acridine (3500-35-00) | 0.12 |
| Triphenyl phosphine (3598-35-00) | 0.05 |
| n-phenyl glycine (3598-35-00) | 0.05 |
| Lissamine Green Background Dye | 0.10 |
| Leuco Crystal Violet | 0.5 |

To the base formulation of Table A were added variable ingredients, particularly different binder polymers and oligomers as per Table B below:

TABLE B

| Variable Ingredients | 1 | 2 | 3 | 4 | 5 | 6 |
|---|---|---|---|---|---|---|
| Combined Materials from Table "A" | | | | | | |
| R-M915 Oligomer (Composition 7) | 29 | 29 | 29 | 29 | 0 | 29 |
| Ethoxlyated Bis "A" dimethacrylate | 0 | 0 | 0 | 0 | 29 | 0 |
| High Molecular Weight Polymer (MMA = 69, MAA = 23, n-BA = 8) | 49.5 | | | | | |
| Low Molecular Weight/Styrene Containing (Styrene = 64, MAA = 36) | | 49.5 | | | | |
| Low Molecular Weight/non Styrene (MMA = 64, MAA = 36) | | | 49.5 | | | |
| Low Molecular Weight/non Styrene (MMA = 56, MAA = 36, n-BA = 8) | | | | 49.5 | 49.5 | |
| Low Molecular Weight/non Styrene (MMA = 64, MAA = 23) | | | | | | 49.5 |
| Acid Number | 150 | 235 | 235 | 235 | 235 | 150 |
| Molecular Weight | 85,000 | 35,000 | 35,000 | 35,000 | 35,000 | 35,000 |
| Tg | 90 | 130 | 130 | 105 | 105 | 130 |

Processing conditions and performance results of the photoimageable compositions of that photoresists of Table B are given in Table C:

Moreover, with the exception of the styrene-containing low-molecular weight polymer (2), the stripped particle size and stripping for overplated panels is greatly improved.

TABLE C

| Performance Test | 1 | 2 | 3 [Acceptable] | 4 [Acceptable] | 5 | 6 [Acceptable] | Performance Goal |
|---|---|---|---|---|---|---|---|
| Developing Time (1% Na$_2$CO$_3$, 30 C, sec) | 64 | 48 | 44 | 39 | 38 | 42 | <45 |
| Resolution (smallest space resolved, microns) | 70 | 45 | 40 | 45 | 40 | 40 | <50 |
| Adhesion, stress conditions (smallest line left intact, microns) | 40 | 60 | 50 | 50 | 55 | 50 | <55 |
| Tenting Strength (grams required for fracture) | 1250 | 475 | 855 | 1350 | 225 | 875 | >800 |
| Stripping Time (3% NaOH, 45 C, sec) | 90 | 65 | 22 | 35 | 30 | 40 | <45 |
| Stripping Particle Size (mm) | >100 | >100 | 5 | 10 | 2 | 10 | <20 |
| Overplate Stripping (smallest line stripped clean, microns) | 200 | 100 | 35 | 50 | 100 | 75 | <75 |
| Roll Edge Fusion (room temp., 30 days) | None | Slight | None | None | Severe | None | None |

Discussion of Experimental Results

While the standard, high molecular weight polymers provide good adhesion, tenting strength, and roll properties (1), the developing time, resolution, stripping and overplate stripping are compromised. In the past, the addition of low molecular weight polymers had to be strictly limited. If as much as 50 wt % of the polymer system was comprised of a polymer of molecular weight below 60,000, severe edge fusion and tenting strength reductions were commonly observed. Obviously, a 100% low molecular weight was considered unacceptable with respect to predicted edge fusion and tent strength properties.

Surprisingly, with the addition of the new polyester containing oligomers, the tolerance for low molecular weight systems is greatly improved (5) vs. (3), (4) and (6). Even though the entire polymer system is below 60,000 molecular weight, there is no sign of edge fusion, and tenting strength is acceptable.

In conclusion, the new polyester oligomers, by themselves, provide photoresists with poor stripping performance. Low molecular weight polymers, by themselves, provide photoresists that suffer from roll edge fusion and tent strength problems. Together, the polyester oligomers and low molecular weight polymers (non-styrene-containing) perform synergistically with very good overall performance in all areas.

From the foregoing it will be seen that this invention is one well adapted to attain all ends and objects hereinabove set forth together with the other advantages which are apparent and inherent. Since many possible variations may be made of the invention without departing from the scope thereof, the invention is not intended to be limited to the embodiments and examples disclosed, which are considered to be purely exemplary. Accordingly, reference should be made to the appended claims to assess the true spirit and scope of the invention, in which exclusive rights are claimed.

What is claimed is:

1. A negative-acting photoimageable composition developable in alkaline aqueous solution, said composition comprising:
   I) a binder polymer having an acid number of between about 150 and about 300; a weight average molecular weight between about 5000 and about 60,000, and said polymer being free of styrene or styrene homologues;
   II) a photopolymerizable material for said binder polymer; and,
   III) a photoinitiator chemical system,
   wherein all or a portion of said photopolymerizable material comprises a (meth)acrylate functional urethane oligomer, wherein the (meth)acrylate functionality is separated from the urethane linkage by two or more alkylene oxide groups and one or more ring-opened lactone groups.

2. The photoimageable composition of claim 1, wherein the alkylene oxide and ring-opened lactone groups are block copolymerized with each other and the ring-opened lactone groups are located at the terminus opposite the (meth)acrylate functionality.

3. The photoimageable composition of claim 1, wherein the (meth)acrylate functional urethane oligomer is comprised of polymerized units of hexamethylene diisocyanate, the biuret of hexamethylene diisocyanate or the isocyanurate of hexamethylene diisocyanate with a polyfunctional alcohol, the oligomer is end-capped with a polyoxyalkylated polyactone block copolymer mono(methyl)acrylolyl ester.

4. The photoimageable composition of claim 1, wherein said (meth)acrylate functional urethane oligomer comprises between about 5 wt % and about 45 wt % based on total weight of I) plus II) plus III).

5. The photoimageable composition of claim 1 wherein said binder polymer has a weight average molecular weight between about 20,000 and about 30,000.

6. The photoimageable composition of claim 1 wherein the acid number of said binder polymer is between about 150 and about 250.

7. The photoimageable composition of claim 1 wherein said binder polymer further has an acrylate monomer content of between about 1.0 and about 20.0 mole percent of monomer content.

8. A negative-acting photoimageable composition developable in alkaline aqueous solution, said composition comprising:
I) a binder polymer having an acid number of between about 150 and about 300; a weight average molecular weight between about 5000 and about 60,000, and said polymer being free of styrene or styrene homologues;
II) an addition-polymerizable non-gaseous α,β-ethylenically unsaturated compound(s) capable of forming a high polymer by free-radical initiated chain-propagating addition polymerization; and,
III) a radiation-sensitive free-radical generating photoinitiator chemical system activatable by actinic radiation to initiate chain-propagating addition polymerization of the addition-polymerizable material,
   wherein all or a portion of said component II) comprises a (meth)acrylate functional urethane oligomer having the formula:

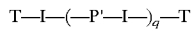

where I at each independent occurrence is a radical of the formula:

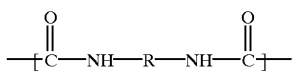

where R is a polyvalent aliphatic, cycloaliphatic, or aromatic hydrocarbon group; T at each independent occurrence is selected from a (meth)acrylate-functional organic radical of the formula:

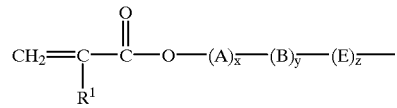

where
R$^1$ is a hydrogen atom or a methyl group, A, B and E are in the order given or in any order, A is an alkylene oxide group of the formula: —[—(CH$_2$)$_n$—O—]—, where n is an integer from 1 to 20, and x is an integer from 1 to 40, B is an alkylene oxide group of the formula: —[—(CH$_2$)$_{n1}$—O—]—, where n1 is an integer from 1 to 20, and y is an integer from 0 to 40 with the alkylene oxide group of B being different from that of A, and A plus B having from at least 2 alkylene oxide groups, and E is a ring-opened lactone group of the formula:

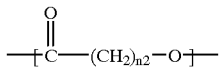

where n2 is an integer from 1 to 20, and z is an integer from 1 to 40;
P is of the formula:

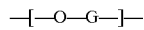

where G is of the formula:

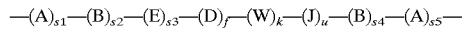

where A, B, E and R are defined above, f, k, and u equal 0 or 1, D is an diester functional alkoxy radical of the formula:

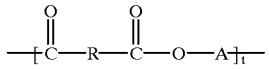

where t is an integer from 1 to 40, W is a radical of the formula:

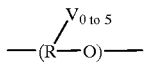

where V is an acidic group selected from —COOH, —SO$_3$H, and PO$_3$HR$^2$ where R$^2$ is a hydrogen atom or a C$_{1-18}$ alkyl radical, J is an ester functional alkyl radical of the formula:

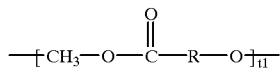

where t1 is an integer from 1 to 6, and, with the proviso that if f+k+u=0, then $\Sigma s_1 \ldots s_5$ must be $\geq 1$; and q is 0 or an integer from 1 to 10.

9. The photoimageable composition of claim 8, wherein q=0.

10. The photoimageable composition of claim 8, wherein q=1 to 10.

11. The photoimageable composition of claim 8, comprising:
   I) between about 30 and about 80 wt %, based on total weight of I) plus II) plus III) of said binder polymer;
   II) between about 20 and about 70 wt % based on total weight of I) plus II) plus III) of said addition-polymerizable, non-gaseous α,β-ethylenically unsaturated compound(s); and,
   III) between about 0.1 and about 20 wt % based on the total weight of I) plus II) plus III) of said photoinitiator chemical system.

12. The photoimageable composition of claim 11, wherein said (meth)acrylate functional urethane oligomer comprises between about 1 and 100 wt. % of II).

13. A dry film photoresist useful in the manufacture of printed circuit boards comprising: a polymeric support sheet and layer of the photoimageable composition of claim 8 thereon.

14. A negative-acting photoimageable composition developable in alkaline aqueous solution, said composition comprising:
   I) a binder polymer having an acid number of between about 150 and about 300; a weight average molecular weight between about 5000 and about 60,000, and said polymer being free of styrene or styrene homologues;
   II) an addition-polymerizable non-gaseous α,β-ethylenically unsaturated compound(s) capable of forming a high polymer by free-radical initiated chain-propagating addition polymerization; and,
   III) a radiation-sensitive free-radical generating photoinitiator chemical system activatable by actinic radiation to initiate chain-propagating addition polymerization of the addition-polymerizable material,
wherein all or a portion of said component II) comprises a (meth)acrylate functional urethane oligomer having the formula:

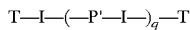

where I at each independent occurrence is a radical of the formula:

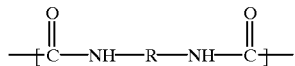

where R is a polyvalent aliphatic, cycloaliphatic, or aromatic hydrocarbon group; T at each independent occurrence is selected from a (meth)acrylate-functional organic radical of the formula:

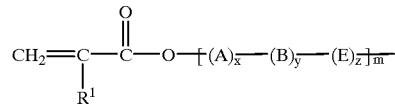

Where $R^1$ is a hydrogen atom or a methyl group, A, B, and E are in the order given or in any order, A is an alkylene oxide group of the formula: $-[-(CH_2)_n-O-]-$, and x is an integer from 1 to 40, B is an alkylene oxide group of the formula: $-[-(CH_2)_{n1}-O-]-$, where n1 is an integer from 0 to 40 with the alkylene oxide group of B being different from that of A, and A plus B having at least 2 alkylene oxide groups, and E is a ring-opened lactone of the formula:

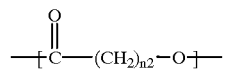

where n2 is an integer from 1 to 20, or E is a ring-opened lactam group of the formula:

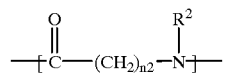

where n2 is defined above and $R^2$ is a hydrogen atom or a $C_{1-18}$ alkyl radical, and z is an integer from 1 to 40, and m is an integer from 1 to 40, or E is a mixture of the ring-opened lactone and the ring-opened lactam; and P is of the formula:

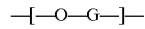

where G is of the formula:

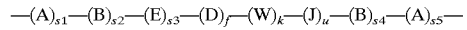

where A, B, E, and R are defined above, and f, k, u are 0 or 1,

D is an diester functional alkoxy radical of the formula:

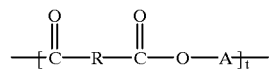

where t is an integer from 1 to 40, W is a radical of the formula:

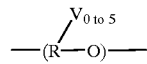

where V is an acidic group selected from —COOH, —SO$_3$H, and PO$_3$HR$^2$ where $R^2$ is a hydrogen atom or a $C_{1-18}$ alkyl radical, J is an ester functional alkyl radical of the formula:

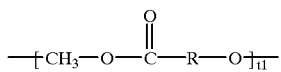

where t1 is an integer from 1 to 6, and, with the proviso that if f+k+u=0, then $\Sigma s_1 \ldots s_5$ must be $\geq 1$.

15. A negative-acting photoimageable composition developable in alkaline aqueous solution, said composition comprising:

I) a binder polymer having an acid number of between about 150 and about 300; a weight average molecular weight between about 5000 and about 60,000, and said polymer being free of styrene or styrene homologues;

II) an addition-polymerizable non-gaseous α,β-ethylenically unsaturated compound(s) capable of forming a high polymer by free-radical initiated chain-propagating addition polymerization; and III) a radiation-sensitive free-radical generating photoinitiator chemical system activatable by actinic radiation to initiate chain-propagating addition polymerization of the addition-polymerizable material, wherein all or a portion of said component II) comprises a (meth)acrylate functional urethane oligomer having a formula:

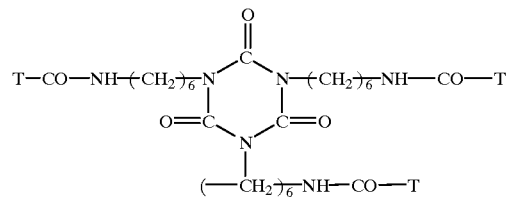

and T is:

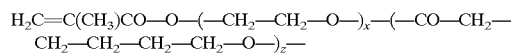

Wherein x=5 or 6 and z=3, 4, or 6.

* * * * *